(12) United States Patent
Toyoda et al.

(10) Patent No.: US 7,453,056 B2
(45) Date of Patent: Nov. 18, 2008

(54) COMPOUND-EYE IMAGING DEVICE

(75) Inventors: Takashi Toyoda, Daito (JP); Yoshizumi Nakao, Daito (JP); Yasuo Masaki, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 0 days.

(21) Appl. No.: 11/759,566

(22) Filed: Jun. 7, 2007

(65) Prior Publication Data
US 2007/0284511 A1 Dec. 13, 2007

(30) Foreign Application Priority Data
Jun. 8, 2006 (JP) .............................. 2006-159503

(51) Int. Cl.
*H01L 27/00* (2006.01)
(52) U.S. Cl. ..................... 250/208.1; 250/216; 359/613
(58) Field of Classification Search .................. 250/216, 250/208.1; 359/613
See application file for complete search history.

(56) References Cited

U.S. PATENT DOCUMENTS 4,663,738 A * 5/1987 Sprague et al. ............. 365/127
6,939,015 B2 * 9/2005 Hodge et al. ................ 359/614
7,009,652 B1 3/2006 Tanida et al.
2003/0021034 A1 * 1/2003 Yoshikawa et al. .......... 359/619
2005/0128596 A1 * 6/2005 Li et al. ...................... 359/619

FOREIGN PATENT DOCUMENTS

| JP | 10-253920 | 9/1998 |
|---|---|---|
| JP | 2001-61109 A | 3/2001 |
| JP | 2004-294270 A | 10/2004 |

* cited by examiner

*Primary Examiner*—Thanh X Luu
*Assistant Examiner*—Kevin Wyatt
(74) *Attorney, Agent, or Firm*—Crowell & Moring LLP (57) ABSTRACT

A compound-eye imaging device comprises: an optical lens array with integrated optical lenses; a stop member; a photo-detector array for imaging multiple images formed by the optical lenses; and a light shielding block for partitioning a space between the two arrays into a matrix of spaces, with light-passing holes, so as to prevent lights emitted from the optical lenses from interfering each other. The light shielding block is formed of unit plates in a stack, each having light-passing windows. Each light-passing window has blackened surface. The unit plates in the stack are alternately reversed upside down and left-right so as to allow the horizontal positions of the light-passing windows for forming each light-passing hole through the unit plates in the stack to be alternately offset in depth direction of the hole, thereby forming an irregular inner wall surface which serves as a light scattering surface to prevent e.g. ghost.

5 Claims, 7 Drawing Sheets

COMPOUND-EYE IMAGING DEVICE

BACKGROUND OF THE INVENTION

1. Field of the Invention

The present invention relates to a compound-eye imaging device having an optical imaging system which is formed of multiple micro optical systems so as to reduce the focal length, making it possible to reduce the thickness of the compound-eye imaging device.

2. Description of the Related Art

There has been developed a compound-eye imaging device as a thin camera module to be installed in a cellular phone, a personal computer, or the like. The compound-eye imaging device is mainly composed of: an optical lens array with multiple integrated optical lenses; a photodetector array for imaging multiple images formed by the respective optical lenses of the optical lens array; and an image reconstructing circuit for reconstructing the multiple images, imaged by the photodetector array, into one image by using parallax information between the multiple images.

Figure 10:
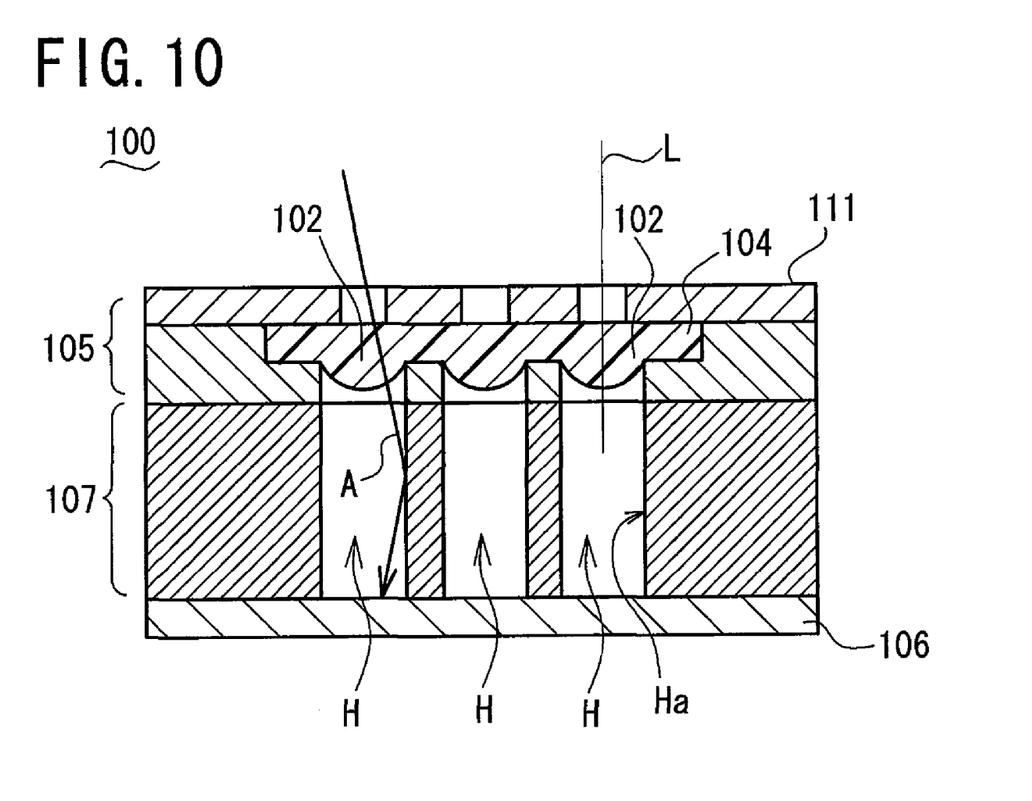
FIG. 10 is a schematic vertical cross-sectional view of a conventional compound-eye imaging device.

It is known to form an image input unit by placing a light shielding block between the optical lens array and the photodetector array for partitioning a space between the optical lens array and the photodetector array into a matrix of spaces as seen on a plane perpendicular to the optical axis of each optical lens so as to prevent lights emitted from the optical lenses from interfering each other (refer to e.g. Japanese Laid-open Patent Publication 2001-61109). FIG. 10 is a schematic vertical cross-sectional view of a conventional compound-eye imaging device 100, showing a general structure of a conventional compound-eye imaging device. The structure of the conventional compound-eye imaging device 100 will be described with reference to FIG. 10.

The compound-eye imaging device 100 comprises: an optical lens array 104 with integrally formed multiple optical lenses 102; a stop member 111 for shielding unnecessary ambient light from entering the optical lenses 102; a photodetector array 106 placed at a predetermined distance from the optical lens array 104 for imaging multiple images respectively formed by the optical lenses 102; and a light shielding block 107 which is placed between the optical lens array 104 and the photodetector array 106, and which has a partition wall for partitioning a space between the optical lens array 104 and the photodetector array 106 into a matrix of spaces as seen on a plane perpendicular to an optical axis L of each optical lens 102 so as to prevent lights emitted from the respective optical lenses 102 from interfering each other. The optical lens array 104 is held by a lens holder 105. The shielding block 107 is formed of a plate-like or flat plate material having a predetermined thickness and having formed therein multiple light-passing holes H which face the respective optical lenses 102. In one way, laser processing is used to form such light-passing holes H in a metal plate. Otherwise, in some cases, a plate-like or flat plate material formed by a photo-curable resin may be used for the light shielding block 107.

In the conventional compound-eye imaging device 100, there is a problem in the quality of formed images. More specifically, as shown by a bent arrow A in FIG. 10, some of the lights emitted from the optical lenses 102, which are expected to directly arrive at the photodetector array 106, may first arrive at an inner wall surface Ha of a light-passing hole H, so as to be reflected by the inner wall surface Ha and then arrive at the photodetector array 106. Because of the existence of both the direct and reflected lights from the optical lenses 102, there is a risk of occurrence of ghost or flare in an image formed by the photodetector array 106.

SUMMARY OF THE INVENTION

An object of the present invention is to provide a compound-eye imaging device which can prevent lights emitted from optical lenses from being reflected by an inner wall surface of a light-passing hole formed in a light shielding block and arriving at a photodetector array so as to cause ghost or flare in an image formed by the photodetector array.

According to the present invention, this object is achieved by a compound-eye imaging device comprising: an optical lens array with multiple integrated optical lenses; a stop member for shielding unnecessary ambient light from entering the optical lenses; a photodetector array placed at a predetermined distance from the optical lens array for imaging images formed by the optical lenses, respectively; and a light shielding block placed between the optical lens array and the photodetector array for partitioning a space between the optical lens array and the photodetector array into a matrix of spaces, with light-passing holes, as seen on a plane perpendicular to the optical axis of each optical lens so as to prevent lights emitted from the optical lenses from interfering each other. The light shielding block is formed of a stack of multiple unit plates, each of which has multiple light-passing windows at horizontal positions thereon corresponding to horizontal positions of the optical lenses for passing lights emitted from the optical lenses so as to form the light-passing holes, respectively, wherein each of the light-passing holes formed by the light-passing windows in the unit plates in the stack has an irregular inner wall surface serving as a light scattering surface.

In this compound-eye imaging device, the inner wall surface of each light-passing hole of the light shielding block is formed to be irregular or uneven to serve as a light scattering or irregularly reflecting surface. Thus, the inner wall surface prevents light reflected by the inner wall surface, among lights emitted from the optical lenses, from arriving at the photodetector array to form ghost (ghost image) and flare in an image formed on the photodetector array. Further, this compound-eye imaging device makes it possible to use unit plates having the same shape, which are stacked by being alternately reversed upside down and left-right, so as to alternately offset the horizontal positions of the light-passing windows in each light-passing hole in the depth direction of the light-passing hole, thereby forming the irregular inner wall surface. Thus, this compound-eye imaging device enables the reduction of the manufacturing cost as compared to that in which different or multiple shapes of unit plates are used. In addition, since the light shielding block is formed of multiple stacked unit plates, the height of the light shielding block can be easily adjusted by changing (increasing or decreasing) the number of unit plates to form the light shielding block, so as to e.g. optimize the distance between the optical lens array and the photodetector array.

Preferably, each of the light-passing windows in each of the unit plates has blackened surface, wherein the unit plates in the stack are alternately reversed upside down and left-right so as to allow the horizontal positions of the light-passing windows for forming each light-passing hole through the unit plates in the stack to be alternately offset in depth direction of the each light-passing hole, thereby forming the irregular inner wall surface.

Further preferably, each of the light-passing windows in each of the unit plates has blackened surface, wherein the light-passing windows of the unit plates in the stack have alternately different sizes so as to allow the horizontal positions of the light-passing windows for forming each light-passing hole through the unit plates in the stack to be alternately offset in depth direction of the each light-passing hole, thereby forming the irregular inner wall surface.

Yet further preferably, each of the unit plates has a tapered surface on the inner wall surface in each of the light-passing windows therein so as to allow each light-passing hole through the unit plates in the stack to have the irregular inner wall surface.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that all the drawings are shown for the purpose of illustrating the technical concept of the present invention or embodiments thereof, wherein.

DESCRIPTION OF THE PREFERRED EMBODIMENTS

Embodiments of the present invention, as best mode for carrying out the invention, will be described hereinafter with reference to the drawings. The present invention relates to a compound-eye imaging device. It is to be understood that the embodiments described herein are not intended as limiting, or encompassing the entire scope of, the present invention. Note that like parts are designated by like reference numerals, characters or symbols throughout the drawings.

First Embodiment

Figure 1:
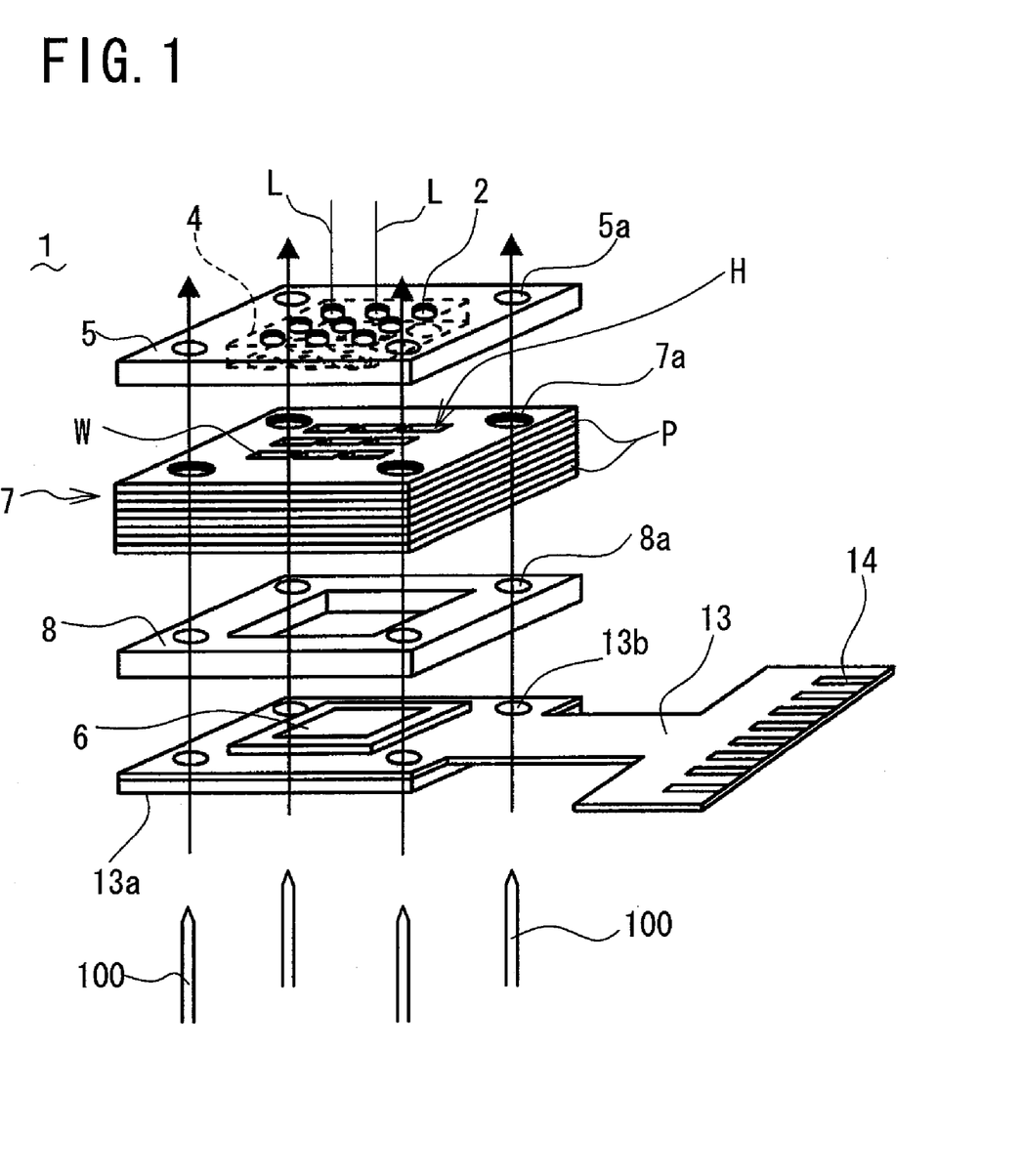
FIG. 1 is a schematic exploded perspective view of a compound-eye imaging device according to a first embodiment of the present invention when assembling the same in its entirety.
Figure 2:
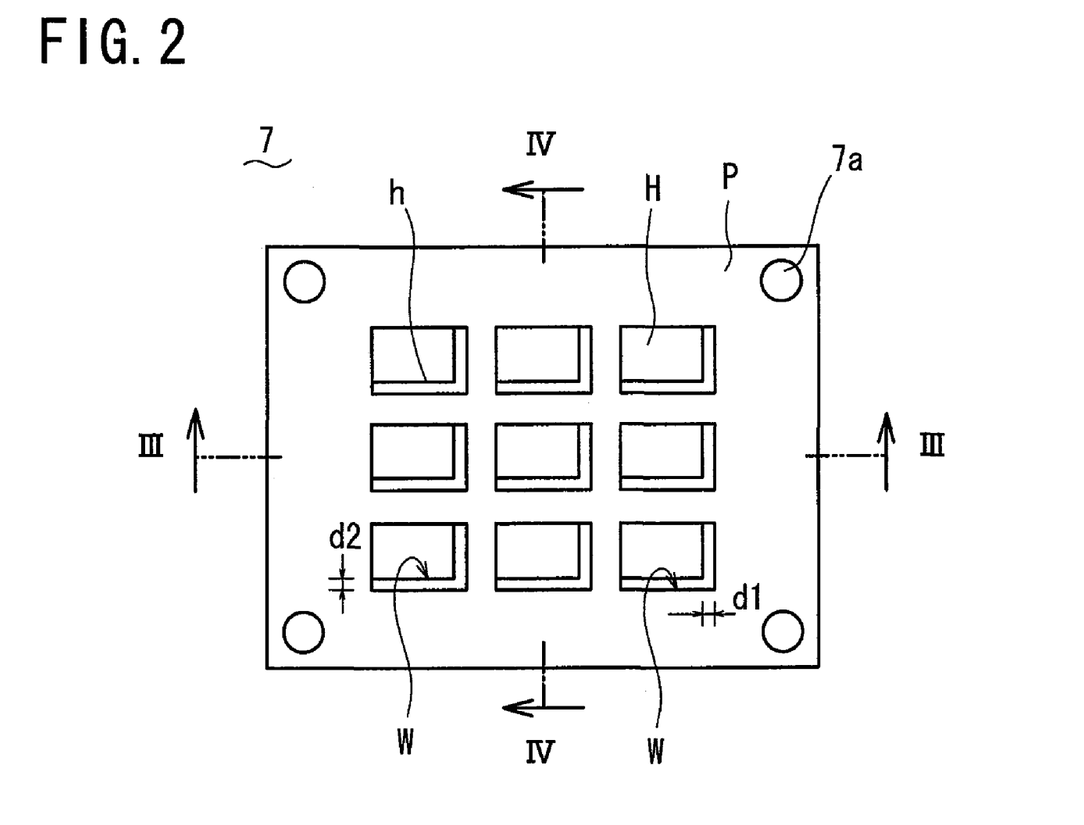
FIG. 2 is a schematic plan view of a light shielding block of the compound-eye imaging device.
Figure 3:
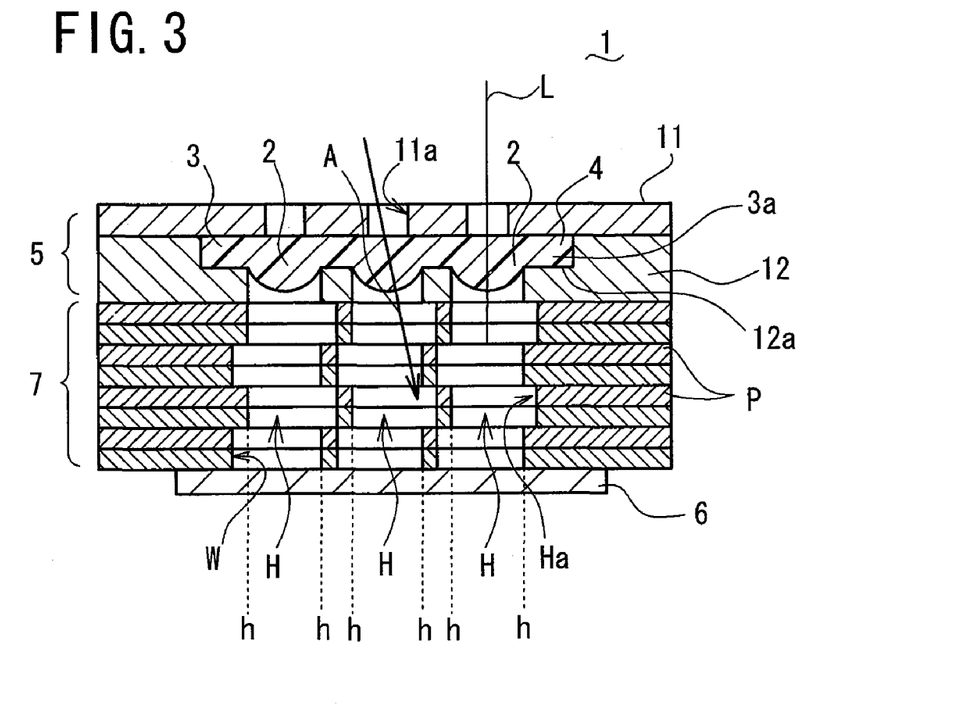
FIG. 3 is a schematic vertical cross-sectional view of the compound-eye imaging device along line III-III of FIG. 2.
Figure 4:
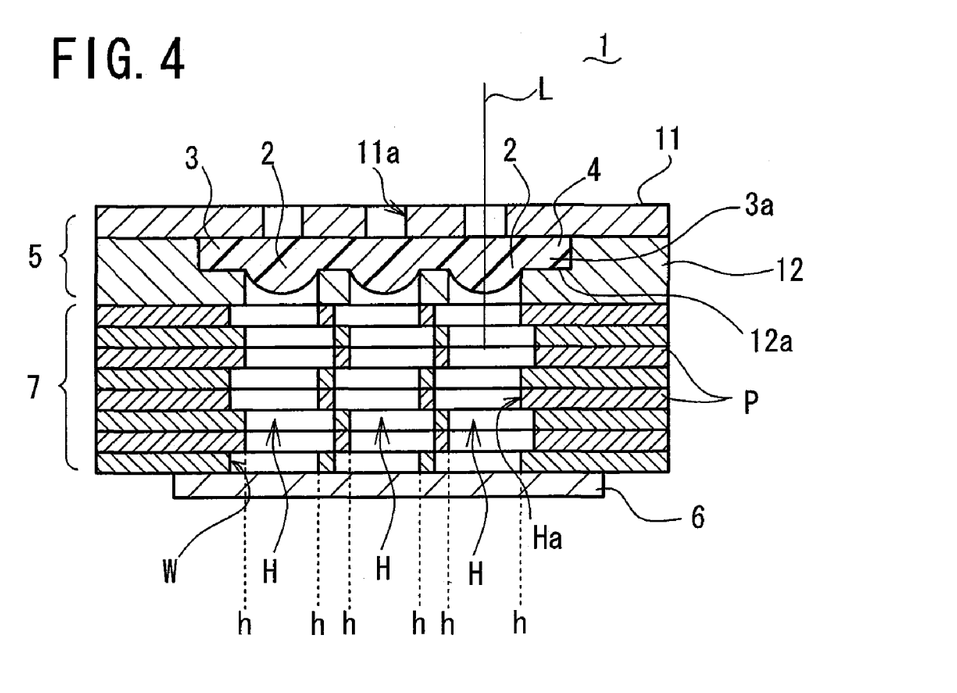
FIG. 4 is a schematic vertical cross-sectional view of the compound-eye imaging device along line IV-IV of FIG. 2.

Referring to FIG. 1 to FIG. 5, a first embodiment of the present invention will be described. FIG. 1 is a schematic exploded perspective view of a compound-eye imaging device 1 according to the present embodiment when assembling the same in its entirety. FIG. 2 is a schematic plan view of a light shielding block 7. FIG. 3 and FIG. 4 are schematic vertical cross-sectional views of the compound-eye imaging device 1 along line III-III and line IV-IV of FIG. 2, respectively, showing, in addition to the light shielding block 7, a lens holder 5 and a photodetector array 6 in the compound-eye imaging device 1. As shown in FIG. 1, FIG. 3 and FIG. 4, the compound-eye imaging device 1 comprises: an optical lens array 4 having 9 (nine) optical lenses 2 which have optical axes L parallel to each other, and which are arranged in a matrix of three rows and three columns and integrally formed as single convex lenses on a lower surface of one transparent substrate 3; and a lens holder 5 for vertically sandwiching and holding the optical lens array 4.

The compound-eye imaging device 1 further comprises: a photodetector array 6 which is placed below, and at a predetermined distance from, the optical lens array 4, and which images 9 (nine) images also arranged in a matrix of three rows and three columns formed by, and corresponding to, the 9 optical lenses 2; a light shielding block 7 which is placed between the optical lens array 4 and the photodetector array 6, and which has a partition wall for partitioning a space between the optical lens array 4 and the photodetector array 6 into a matrix (three rows and three columns) of spaces, with light-passing holes H, as seen on a plane perpendicular to the optical axis L so as to pass lights emitted from the respective optical lenses 2 and to prevent the lights from the optical lenses 2 from interfering each other; and a spacer frame 8 which is placed between the light shielding block 7 and the photodetector array 6, and surrounds the photodetector array 6 so as to prevent the light shielding block 7 from contacting the photodetector array 6. Note that the optical lenses 2 are not required to be integrally formed on the transparent substrate 3, and can be held by a holder so as to be arranged in a matrix on a two-dimensional plane.

As shown in FIG. 3 and FIG. 4, the lens holder 5 is composed of an upper plate 11 and a lower frame 12 having grooves 12a formed in upper inner edges thereof, such that end portions 3a of the optical lens array 4 fit in the grooves 12a. The upper plate 11 has 9 (nine) stop apertures 11a having a predetermined size at 9 positions corresponding to the 9 optical lenses 2 so as to serve as a stop member for shielding unnecessary ambient light from entering the optical lenses 2. The photodetector array 6 shown in FIG. 1 is formed of a semiconductor substrate, and is, for example, a CCD (Charge Coupled Device) image sensor. The photodetector array 6 is mounted on a square portion 13a which is an end portion of a flexible board (circuit board) 13. The flexible board 13 has, at the other end portion thereof, terminals 14 of signal lines extending from the photodetector array (CCD) 6.

As shown in FIG. 1, the lens holder 5, the light shielding block 7, the spacer frame 8 and the square portion 13a of the flexible board 13 are formed in the same-sized square, and have circular through-holes 5a, 7a, 8a and 13b at four corners of each thereof for later-described positioning pins 100 to pass through, respectively. Note that each of the light shielding block 7 and the spacer frame 8 has, in side surfaces thereof, recesses (notches) (not shown) in which an adhesive is to be filled, so as to facilitate bonding and fixedly connecting unit plates P (forming the shielding block 7) to each other as well as the spacer frame 8 and the light shielding block 7 to each other.

Next, the structure of the light shielding block 7 will be described in detail. The light shielding block 7 of the present embodiment is formed of 8 (eight) stacked flat unit plates P each having a thickness of 100 μm. Each of the unit plates P in the stack is formed e.g. of a metal plate such as an iron plate. The metal plate is subjected to an etching (chemical engraving) process capable of fine processing so as to form rectangular light-passing windows W having blackened surface. The light-passing windows W of each unit plate P are formed at horizontal positions on the each unit plate P corresponding to the horizontal positions of the multiple optical lenses 2, respectively, so as to pass lights emitted from the optical lenses 2.

The light-passing windows W of each unit plate P in the stack are substantially vertically aligned with the corresponding light-passing windows W of the other unit plates P in the stack so that each set of substantially vertically light-passing windows W forms a light-passing hole H, thereby forming light-passing holes H, the number of which corresponds to the number of light-passing windows W of each unit plate P. However, as will be described later, the horizontal positions of the light-passing windows W for forming each light-passing hole H through the unit plates P in the stack are alternately offset (staggered) in depth direction of the each light-passing hole H, as seen through the stack in plan view, so as to form an irregular inner wall surface Ha as a light scattering surface.

The thus formed light-passing holes H are arranged in a matrix and are thus partitioned from each other so as to prevent lights emitted from the respective optical lenses 2 from interfering each other. According to the present embodiment, the unit plates P, when stacked, are appropriately reversed horizontally (left-right) and vertically (upside down), so that the horizontal positions of the light-passing windows W for forming each light-passing hole H through the unit plates P in the stack are alternately offset (staggered) in depth direction of the each light-passing hole H as seen through the stack in plan view. Thus, each light-passing hole H has an irregular or uneven inner wall surface Ha serving as a light scattering surface. This will be described in detail below.

Figure 5A:
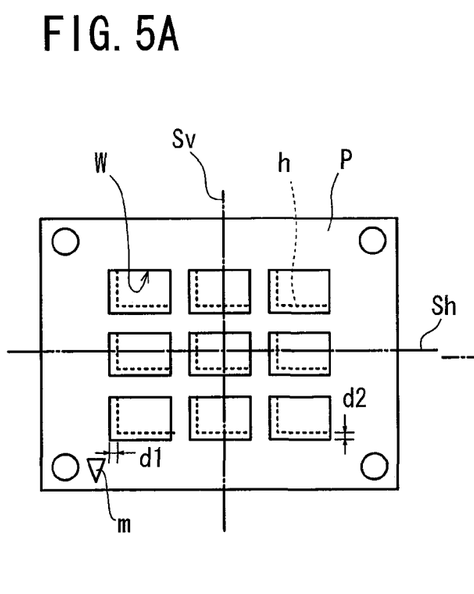
FIG. 5A is a schematic plan view of an upper surface of a unit plate in a basic state to be used for forming a light shielding block.
Figure 5B:
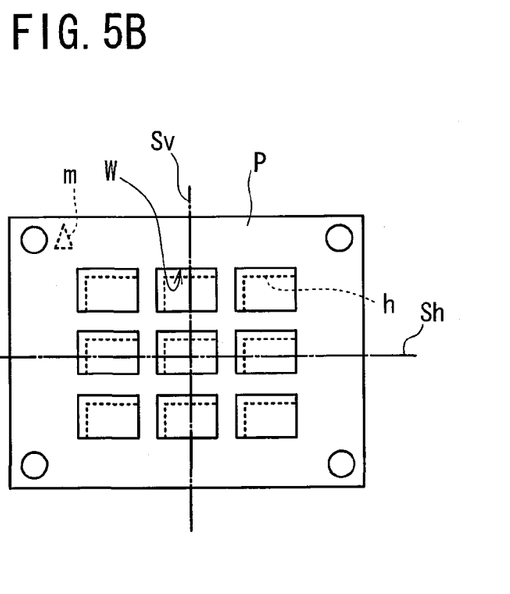
FIG. 5B is a schematic plan view of a lower surface of the unit plate of FIG. 5A reversed upside down from that shown in FIG. 5A.
Figure 5C:
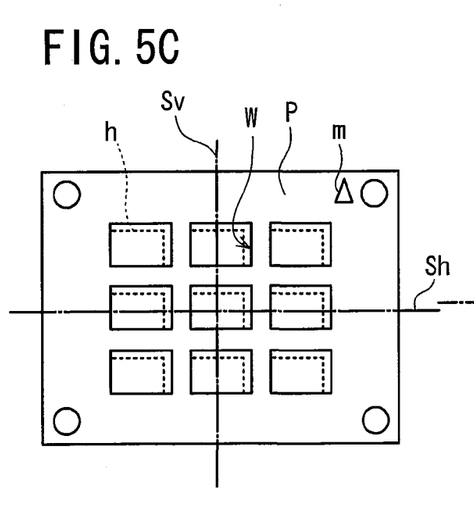
FIG. 5C is a schematic plan view of the upper surface of the unit plate reversed left-right from that shown in FIG. 5B.
Figure 5D:
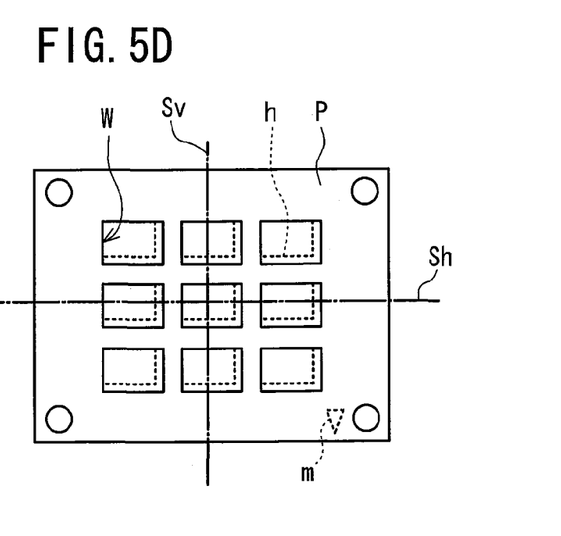
FIG. 5D is a schematic plan view of the lower surface of the unit plate reversed upside down from that shown in FIG. 5C.

Referring to FIG. 5A to FIG. 5D, a method of stacking multiple unit plates P having the same shape to form light-passing holes H with an irregular inner wall surface Ha will be described. FIG. 5A is a schematic plan view of an upper surface of a unit plate P in a basic state to be used for forming a light shielding block 7, in which Sv and Sh designate a longitudinal (up and down) center line and a lateral (left and right) center line, respectively. FIG. 5B is a schematic plan view of a lower surface of the unit plate P of FIG. 5A reversed upside down from that shown in FIG. 5A by rotating it 180 degrees about the lateral center line Sh. FIG. 5C is a schematic plan view of the upper surface of the unit plate P reversed left-right from that shown in FIG. 5B by rotating it 180 degrees about the longitudinal center line Sv, while FIG. 5D is a schematic plan view of the lower surface of the unit plate P reversed upside down from that shown in FIG. 5C by rotating it 180 degrees about the lateral center line Sh. Note that a triangular mark m is placed at a lower left position on the upper surface of the unit plate P so as to facilitate recognizing the orientation of the unit plate P and distinguishing the upper surface from the lower surface of the unit plate P.

Referring now to FIG. 5A (basic state), the light-passing windows W formed in each unit plate P will be described. In each unit plate P, 9 (nine) light-passing windows W in a matrix of 3 (three) rows and 3 (three) columns are formed so as to form 9 (nine) light-passing holes H facing the respective optical lenses 2. The 9 light-passing windows W include 9 (nine) effective light-passing areas of the 9 light-passing holes H. Each effective light-passing area is a rectangular area defined by a boundary h shown therein by a bent dashed line, which indicates two sides of the rectangular area, and by two further sides of the rectangular area contained in two sides of each window W.

The 9 effective light-passing areas defined by the boundaries h, respectively, are positioned symmetrically left and right with respect to the longitudinal center line Sv, which longitudinally passes through the center of the unit plate P. The effective light-passing areas are also positioned symmetrically up and down with respect to the lateral center line Sh, which laterally passes through the center of the unit plate P. As shown in FIG. 5A, each light-passing window W has a rectangular shape slightly expanded leftward and downward from each effective light-passing area shown and defined by the dashed line h. More specifically, the light-passing window W actually formed in each unit plate P is expanded leftward by a distance d1 and downward by a distance d2 from each corresponding effective light-passing area shown and defined by the dashed line h.

Accordingly, when the unit plate P shown in FIG. 5A is reversed upside down, the lower surface of the unit plate P appears as shown in FIG. 5B. In the state shown in FIG. 5B, each light-passing window W has a rectangular shape expanded leftward by the distance d1 and upward by the distance d2 from each corresponding effective light-passing area shown by the dashed line h. Next, when the unit plate P shown in FIG. 5B is reversed left-right, the upper surface of the unit plate P appears again as shown in FIG. 5C. In the state shown in FIG. 5C, each light-passing window W has a rectangular shape expanded rightward by the distance d1 and upward by the distance d2 from each corresponding effective light-passing area shown by the dashed line h. Similarly, when the unit plate P shown in FIG. 5C is reversed upside down, the lower surface of the unit plate P appears again as shown in FIG. 5D. In the state shown in FIG. 5D, each light-passing window W has a rectangular shape expanded rightward by the distance d1 and downward by the distance d2 from each corresponding effective light-passing area shown by the dashed line h.

In this way, four apparent kinds (shapes) of unit plates P of FIG. 5A to FIG. 5D can be prepared. That is, a unit plate P as shown in FIG. 5A is first prepared, which has light-passing windows W each expanded left downward from an effective light-passing area defined by the dashed line h. Then, a unit plate P as shown in FIG. 5B is prepared, which is the same as that of FIG. 5A, but reversed upside down from that of FIG. 5A, and has the light-passing windows W each expanded left upward from the effective light-passing area. Further, a unit plate P as shown in FIG. 5C is prepared, which is the same as that of FIG. 5B, but reversed left-right from that of FIG. 5B, and has the light-passing windows W each expanded right upward. Yet further, a unit plate P as shown in FIG. 5D is prepared, which is the same as that of FIG. 5C, but reversed upside down again from that of FIG. 5C, and has the light-passing windows W each expanded right downward.

The light shielding block 7 is formed by sequentially stacking the four apparent kinds of unit plates P. More specifically, in a first sequence, a unit plate P shown in FIG. 5A is first placed at the bottom, and a unit plate P shown in FIG. 5B is placed thereon. On the thus placed unit plate P shown in FIG. 5B, a unit plate P shown in FIG. 5C is placed, and a unit plate P shown in FIG. 5D is further placed thereon. On the thus placed unit plate P shown in FIG. 5D, a unit plate P shown in FIG. 5A is placed in a second sequence. On the thus placed unit plate P shown in FIG. 5A, unit plates P shown in FIG. 5B, FIG. 5C and FIG. 5D are again placed sequentially, thereby forming a stack of eight unit plates P shown in FIGS. 5A, 5B, 5C, 5D, 5A, 5B, 5C and 5D in this order.

FIG. 2 shows a top plan view of the thus formed light shielding block 7 with the eight unit plates P being stacked on each other, while FIG. 3 and FIG. 4 show vertical cross-sectional views along line III-III and line IV-IV of FIG. 2, respectively, showing, in addition to the light shielding block 7, the lens holder 5 and the photodetector array 6 in the compound-eye imaging device 1. FIG. 3 and FIG. 4 show the horizontal position of the boundary h of each light-passing area as seen in the vertical cross-sectional view. Each of the light-passing holes H formed by stacking the unit plates P has an inner wall surface Ha that is an irregular or uneven surface as shown in FIG. 3 and FIG. 4, which irregularly reflects and scatters light such as shown by a long arrow A in FIG. 3 among lights emitted from the optical lenses 2 and directed toward the photodetector array 6. This light scattering or irregular reflection makes it possible to prevent ghost (ghost image) and flare from being produced in an image formed by the photodetector array 6.

Next, a process of assembling, into the compound-eye imaging device 1, of the lens holder 5, the light shielding block 7, the spacer frame 8 and the flexible board 13 with the photodetector array 6 mounted thereon will be described with reference to the above drawings, particularly FIG. 1. As shown in FIG. 1, the flexible board 13, the spacer frame 8, the light shielding block 7 and the lens holder 5 are inserted in this order into positioning pins 100 which are separately prepared. The light shielding block 7 is formed of total 8 (eight) stacked unit plates P in the above-described manner in advance. The flexible board 13, the spacer frame 8, the light shielding block 7 and the lens holder 5 are thus positioned by being inserted in the positioning pins 100 so as to allow lights emitted from the optical lenses 2 to form an image accurately on the photodetector array 6 through the respective light-passing holes H. If, at this time, the light shielding block 7 has a height (thickness) which is too large or too small relative to the focal length of each optical lens 2, the height can be easily adjusted by increasing or decreasing the number of unit plates P to form the light shielding block 7.

Thereafter, an adhesive is filled in notches (recesses) (not shown) provided in each side surface of the light shielding block 7 and in notches (not shown) in each side surface of the spacer frame 8 so as to fix the flexible board 13, the spacer frame 8, the light shielding block 7 and the lens holder 5 together into essentially one single body. Subsequently, the positioning pins 100 are removed from the flexible board 13, the spacer frame 8, the light shielding block 7 and the lens holder 5. It is apparent from the foregoing that the compound-eye imaging device 1 according to the first embodiment only requires one kind (one shape) of unit plates P, and thus can reduce the manufacturing cost as compared to that in which multiple kinds (multiple shapes) of unit plates are prepared.

Second Embodiment

Figure 6:
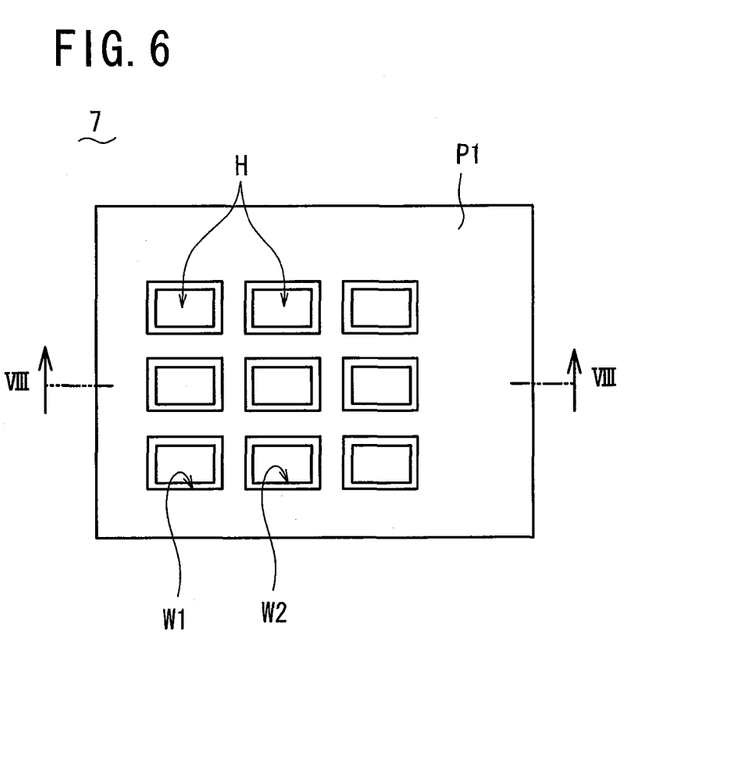
FIG. 6 is a schematic plan view of a light shielding block used in a compound-eye imaging device according to a second embodiment of the present invention.
Figure 7A:
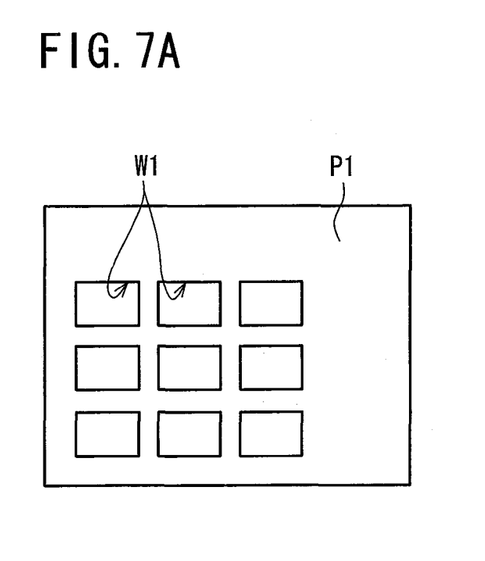
FIG. 7A and FIG. 7B are schematic plan views of a first unit plate and a second unit plate, respectively, to form the light shielding block.
Figure 7B:
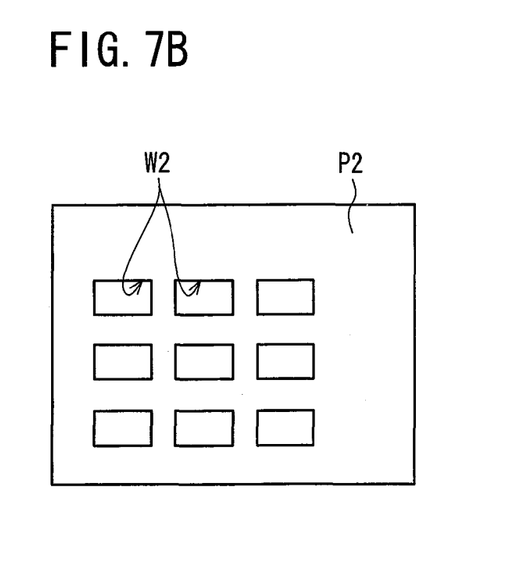
Figure 8:
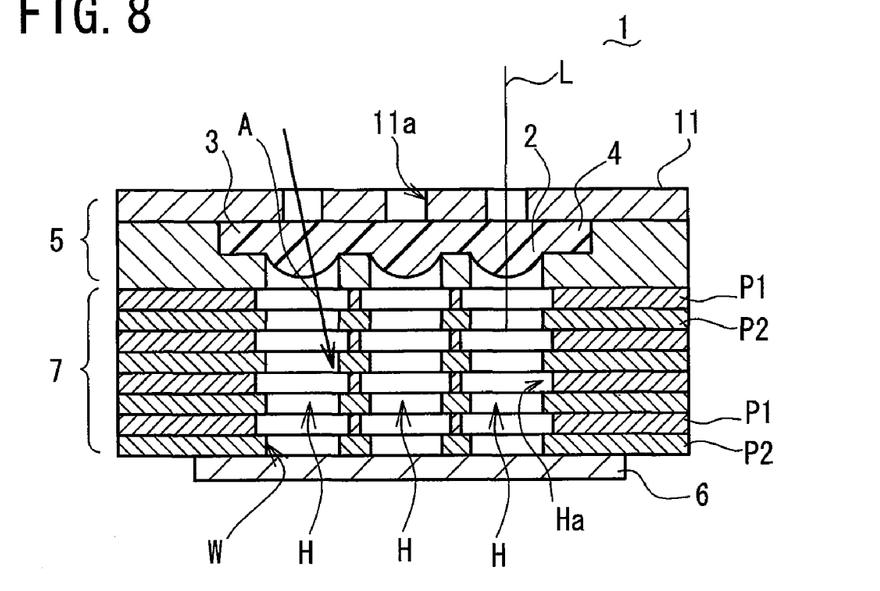
FIG. 8 is a schematic vertical cross-sectional view of the compound-eye imaging device along line VIII-VIII of FIG. 6.

Referring now to FIG. 6 to FIG. 8, a second embodiment of the present invention will be described. FIG. 6 is a schematic plan view of a light shielding block 7 used in a compound-eye imaging device 1 according to the second embodiment. FIG. 7A and FIG. 7B are schematic plan views of a first unit plate P1 and a second unit plate P2, respectively, to form the light shielding block 7. On the other hand, FIG. 8 is a schematic vertical cross-sectional view of the compound-eye imaging device 1 along line VIII-VIII of FIG. 6, showing, in addition to the light shielding block 7, a lens holder 5 and a photodetector array 6 in the compound-eye imaging device 1. The compound-eye imaging device 1 of the second embodiment is similar to that of the first embodiment, except that the light shielding block 7 here is formed of two kinds of unit plates P1, P2 stacked on each other which are different from each other in shape. Thus, except for the unit plates, the other elements of the compound-eye imaging device 1 of the present embodiment are designated by the same reference numerals as the first embodiment, and the description thereof is omitted.

The light shielding block 7 of the second embodiment is formed of two kinds of unit plates, first unit plates P1 and second unit plates P2, alternately stacked on each other. More specifically, the first unit plate P1 has relatively large rectangular light-passing windows W1 as shown in FIG. 7A, while the second unit plate P2 has relatively small rectangular light-passing windows W2, so as to form light-passing windows (W1, W2) having alternately different sizes, although both first and second unit plates P1, P2 have the same external shape and size. Furthermore, the light-passing windows W1, W2 of the first and second unit plates P1, P2 have the same center position (in each light-passing hole H) and similar shapes with different sizes. The light shielding block 7 is formed by alternately stacking the two kinds of unit plates P1, P2. More specifically, in a first sequence, a second unit plate P2 shown in FIG. 7B is first placed at the bottom, and a first unit plate P1 shown in FIG. 7A is placed thereon. On the thus placed unit plate P1, a second and a first unit plates P2, P1 are again placed in a second sequence. In this way, second and first unit plates P2, P1 are alternately and repeatedly stacked in four sequences in total, thereby forming a stack of eight unit plates (four each of the second and first unit plates) P2, P1.

FIG. 6 shows the thus formed light shielding block 7 as seen in plan view, having a stack of total eight unit plates P1, P2, while FIG. 8 shows the vertical cross-sectional view of the light shielding block 7 along line VIII-VIII of FIG. 6 together with the lens holder 5 and the photodetector array 6 in the compound-eye imaging device 1. Each of the light-passing holes H formed by stacking the two kinds of unit plates P1, P2 has an inner wall surface Ha that is an irregular or uneven surface as shown in FIG. 8, which irregularly reflects and scatters light such as shown by a long arrow A in FIG. 8 among lights emitted from the optical lenses 2 and directed toward the photodetector array 6. This light scattering or irregular reflection makes it possible to prevent ghost (ghost image) and flare from being produced in an image formed by the photodetector array 6.

A feature of the second embodiment, in contrast to the first embodiment, is that the effective light-passing areas of the light-passing holes H (windows W1, W2) are not required to be symmetrically left and right with respect to the longitudinal center line and symmetrically up and down with respect to the lateral center line in each unit plate. In other words, the concept of the second embodiment can work even if the light-passing holes H or their effective light-passing areas are displaced or offset from the center of each of the unit plates P1, P2. The use of only one kind of unit plates as in the first embodiment does not work, if it is required to make such light shielding block 7 having light-passing holes displaced or offset from the center of each unit plate as shown e.g. in FIG. 6. That is, if only one kind of unit plates (for example, unit plates P1 shown in FIG. 7A) were used in an attempt to make a light shielding block having a stack of unit plates by alternately reversing them upside down and left-right similarly as in the first embodiment, there would be a risk that the resultant light shielding block would have extremely small or no effective light-passing areas. In contrast, in the second embodiment, there is no risk for the resultant light shielding block 7 to have extremely small or no effective light-passing areas of the light passing holes H when the two kinds of unit plates P1, P2 are alternately stacked on each other.

Third Embodiment

Figure 9:
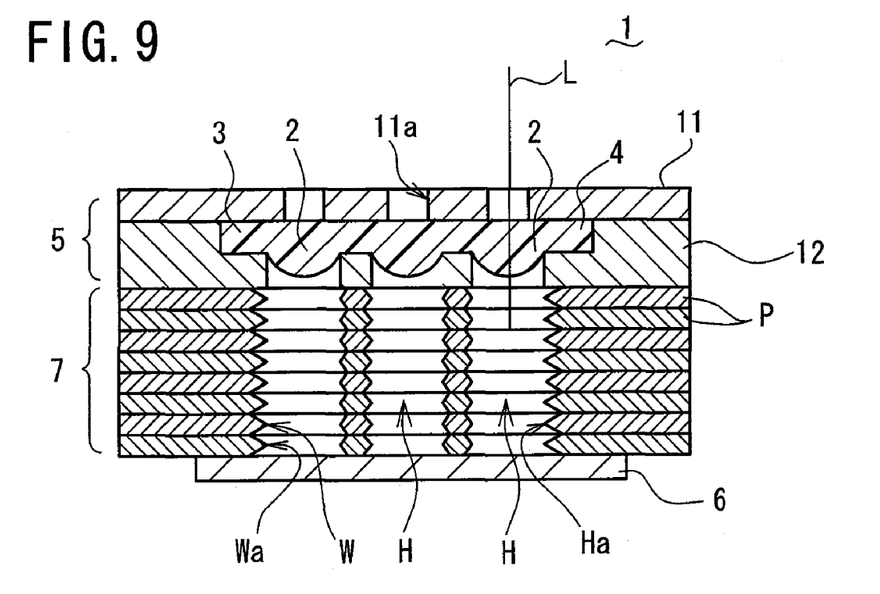
FIG. 9 is a schematic vertical cross-sectional view of a compound-eye imaging device of a third embodiment of the present invention.

Referring now to FIG. 9, a third embodiment of the present invention will be described. FIG. 9 is a schematic vertical cross-sectional view, corresponding to the vertical cross-sectional view of FIG. 3, FIG. 4 and FIG. 8, of a compound-eye imaging device 1 according to the third embodiment. A feature of the compound-eye imaging device 1 of the present embodiment is that, as shown in FIG. 9, each of the unit plates P has a tapered surface on an inner wall surface Wa in each of the light-passing windows W therein so as to form an irregular or uneven inner wall surface Ha, which serves as a light scattering surface, in each of the light-passing holes H of the light shielding block 7. Except for this difference in the way of the formation of the inner wall surface Ha, the compound-eye imaging device 1 of the present embodiment is similar to that of the first or the second embodiment. Thus, the other elements of the compound-eye imaging device 1 of the present embodiment are designated by the same reference numerals as the first and second embodiments, and the description thereof is omitted.

The tapered surface on each inner wall surface Wa can have any appropriate shape. A typical example of the shape of the tapered surface is such that the cross section of the tapered surface in a plane, which is parallel to the optical axis L and perpendicular to the inner wall surface Wa or the side of the light-passing window W, is a triangle with a base having a length equal to the thickness of the unit plate P and with an apex located away from the base. Each of the light-passing windows W formed in each unit plate P may have an appropriate size at an appropriate position. For example, the sizes and the positions of the light-passing windows W in each unit plate P can be the same as those in the other unit plates P. Otherwise, as in the first embodiment, the positions of the light-passing windows W in the respective unit plates P can be alternately offset (staggered). Furthermore, as in the second embodiment, the sizes of the light-passing windows W in the respective unit plates P can be different from one another. Note that the tapered surface on each inner wall surface Wa can be formed by any appropriate process such as etching or drilling using a drill with a tapered bit.

In all the embodiments described hereinabove, the inner wall surface Ha of each of the light-passing holes H is formed to have an irregular or uneven surface to serve as a light scattering surface. Thus, the inner wall surface Ha irregularly reflects and scatters light such as shown by a long arrow A in the drawings among lights emitted from the optical lenses 2 and directed toward the photodetector array 6, so that the inner wall surface Ha prevents the light from arriving at the photodetector array 6 to form ghost (ghost image) and flare in an image formed on the photodetector array 6.

The present invention has been described above using presently preferred embodiments, but such description should not be interpreted as limiting the present invention. Various modifications will become obvious, evident or apparent to those ordinarily skilled in the art, who have read the description. Accordingly, the appended claims should be interpreted to cover all modifications and alterations which fall within the spirit and scope of the present invention.

This application is based on Japanese patent application 2006-159503 filed Jun. 8, 2006, the content of which is hereby incorporated by reference.

What is claimed is:

1. A compound-eye imaging device comprising:
an optical lens array with multiple integrated optical lenses;
a stop member for shielding unnecessary ambient light from entering the optical lenses;
a photodetector array placed at a predetermined distance from the optical lens array for imaging images formed by the optical lenses, respectively; and
a light shielding block placed between the optical lens array and the photodetector array for partitioning a space between the optical lens array and the photodetector array into a matrix of spaces, with light-passing holes, as seen on a plane perpendicular to the optical axis of each optical lens so as to prevent lights emitted from the optical lenses from interfering each other,
wherein the light shielding block is formed of a stack of multiple unit plates, each of which has multiple light-passing windows at horizontal positions thereon corresponding to horizontal positions of the optical lenses for passing lights emitted from the optical lenses so as to form the light-passing holes, respectively, and
wherein each of the light-passing holes formed by the light-passing windows in the unit plates in the stack has an irregular inner wall surface serving as a light scattering surface.

2. The compound-eye imaging device according to claim 1, wherein each of the light-passing windows in each of the unit plates has blackened surface, and
wherein the unit plates in the stack are alternately reversed upside down and left-right so as to allow the horizontal positions of the light-passing windows for forming each light-passing hole through the unit plates in the stack to be alternately offset in depth direction of the each light-passing hole, thereby forming the irregular inner wall surface.

3. The compound-eye imaging device according to claim 1, wherein each of the light-passing windows in each of the unit plates has blackened surface, and
wherein the light-passing windows of the unit plates in the stack have alternately different sizes so as to allow the horizontal positions of the light-passing windows for forming each light-passing hole through the unit plates in the stack to be alternately offset in depth direction of the each light-passing hole, thereby forming the irregular inner wall surface.

4. The compound-eye imaging device according to claim 1, wherein each of the unit plates has a tapered surface on the inner wall surface in each of the light-passing windows therein so as to allow each light-passing hole through the unit plates in the stack to have the irregular inner wall surface.

5. The compound-eye imaging device according to claim 1, wherein the horizontal positions of the light-passing windows are staggered in the depth direction of each of the light-passing holes, thereby forming the irregular inner wall surface.

* * * * *